United States Patent
Tan et al.

(10) Patent No.: US 9,627,019 B2
(45) Date of Patent: Apr. 18, 2017

(54) HIGH SPEED FPGA BOOT-UP THROUGH CONCURRENT MULTI-FRAME CONFIGURATION SCHEME

(71) Applicant: ALTERA CORPORATION, San Jose, CA (US)

(72) Inventors: Jun Pin Tan, Selangor (MY); Kiun Kiet Jong, Penang (MY); Lai Pheng Tan, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/197,356

(22) Filed: Jun. 29, 2016

(65) Prior Publication Data

US 2016/0307612 A1    Oct. 20, 2016

Related U.S. Application Data

(63) Continuation of application No. 14/685,098, filed on Apr. 13, 2015, now Pat. No. 9,401,190.

(51) Int. Cl.
| | |
|---|---|
| *G06F 7/38* | (2006.01) |
| *H03K 19/177* | (2006.01) |
| *G11C 8/04* | (2006.01) |
| *G11C 7/00* | (2006.01) |
| *G11C 7/10* | (2006.01) |

(52) U.S. Cl.
CPC .............. *G11C 8/04* (2013.01); *G11C 7/00* (2013.01); *H03K 19/1776* (2013.01); *H03K 19/17776* (2013.01); *G11C 7/1039* (2013.01)

(58) Field of Classification Search
None
See application file for complete search history.

(56) References Cited

U.S. PATENT DOCUMENTS

6,664,807 B1 * 12/2003 Crotty .................. G11C 7/1048
326/39
7,142,442 B1 * 11/2006 Vadi ......................... G11C 7/12
365/189.08

OTHER PUBLICATIONS

Extended European Search Report for EP Application No. 16164610 Mailed Sep. 6, 2016; 8 Pages.

* cited by examiner

*Primary Examiner* — Anh Tran
(74) *Attorney, Agent, or Firm* — Fletcher Yoder, P.C.

(57) ABSTRACT

Systems and methods are provided herein for implementing a programmable integrated circuit device that enables high-speed FPGA boot-up through a significant reduction of configuration time. By enabling high-speed FPGA boot-up, the programmable integrated circuit device will be able to accommodate applications that require faster boot-up time than conventional programmable integrated circuit devices are able to accommodate. In order to enable high-speed boot-up, dedicated address registers are implemented for each data line segment of a data line, which in turn significantly reduces configuration random access memory (CRAM) write time (e.g., by a factor of at least two).

20 Claims, 7 Drawing Sheets

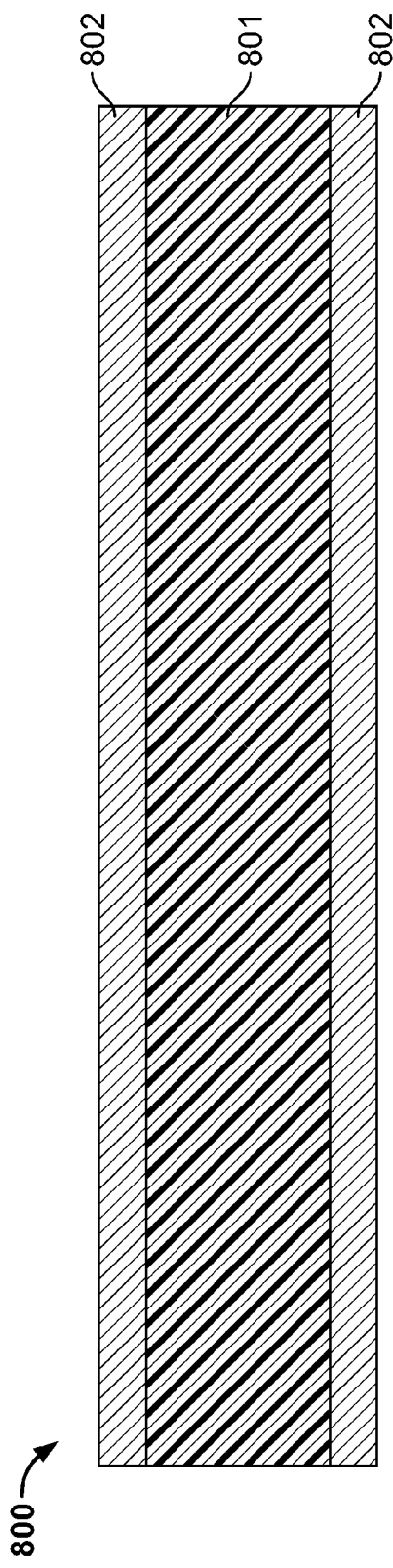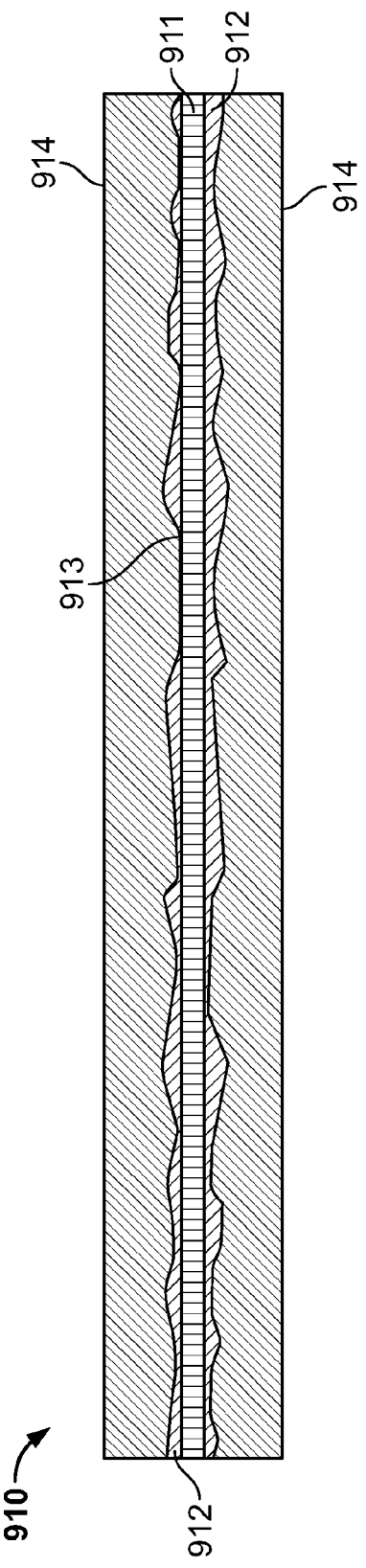

US 9,627,019 B2

HIGH SPEED FPGA BOOT-UP THROUGH CONCURRENT MULTI-FRAME CONFIGURATION SCHEME

CROSS REFERENCE TO RELATED APPLICATIONS

This application is a Continuation of U.S. patent application Ser. No. 14/685,098, entitled "High Speed FPGA Boot-Up Through Concurrent Multi-Frame Configuration Scheme", filed on Apr. 13, 2015, which is herein incorporated by reference in its entirety and for all purposes.

BACKGROUND

Integrated circuit devices such as field programmable gate array (FPGA) devices are known to suffer bottlenecks that prevent high-speed boot-up by causing less than optimal configuration random access memory (CRAM) programming time. Accordingly, applications that require boot-up time that is faster than a programming time offered in a programmable integrated circuit device, such as an FPGA device, cannot be implemented in such a device. Typically, these bottlenecks are formed because configuration time is not scalable in conventional programmable integrated circuit devices, and therefore, the larger the device required to run an application, the larger the configuration time per data frame becomes. For example, as FPGA designs are scaled larger, data lines and address lines become larger, thus requiring more time to be configured.

SUMMARY

Systems and methods are provided herein for implementing a programmable integrated circuit device that enables high-speed FPGA boot-up through a significant reduction of configuration time. By enabling high-speed FPGA boot-up, the programmable integrated circuit device is able to accommodate applications that require faster boot-up time than conventional programmable integrated circuit devices are able to accommodate.

In order to enable high-speed boot-up, dedicated address registers are implemented for each data line segment of a data line, which in turn significantly reduces configuration random access memory (CRAM) write time (e.g., by a factor of at least two).

BRIEF DESCRIPTION OF DRAWINGS

Further features of the invention, its nature and various advantages will be apparent upon consideration of the following detailed description, taken in conjunction with the accompanying drawings, in which like reference characters refer to like parts throughout, and in which:

FIG. 8 is a cross-sectional view of a magnetic data storage medium encoded with a set of machine-executable instructions for performing methods described herein, in accordance with some embodiments of this disclosure; and FIG. 9 is a cross-sectional view of an optically-readable data storage medium encoded with a set of machine executable instructions for performing methods described herein, in accordance with some embodiments of this disclosure.

DETAILED DESCRIPTION

Figure 1:
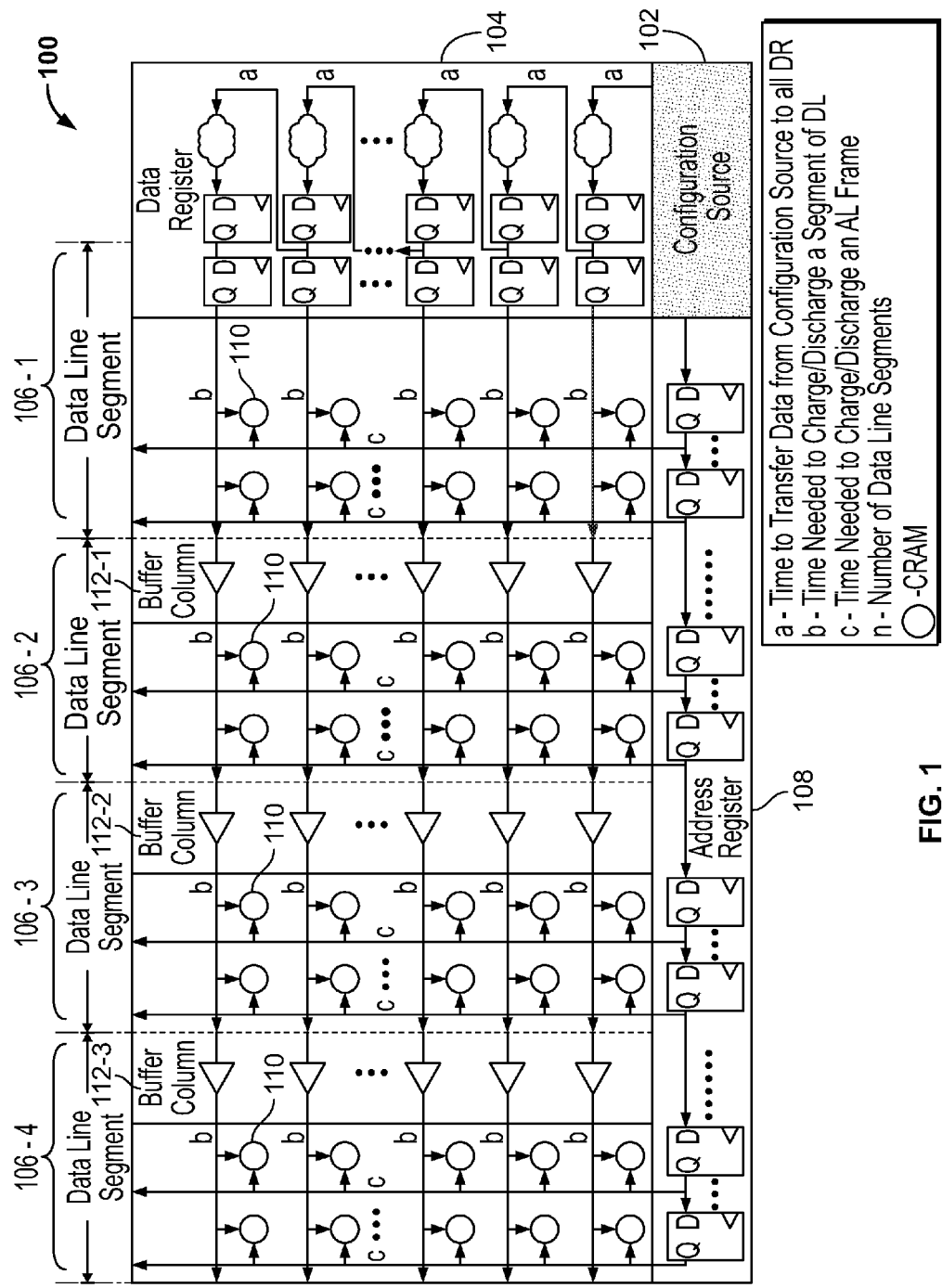
FIG. 1 depicts a programmable integrated circuit device including a configuration source, a data register, data line segments, and an address register, in accordance with some embodiments of this disclosure.

FIG. 1 depicts a programmable integrated circuit device including a configuration source, a data register, data line segments, and an address register, in accordance with some embodiments of this disclosure. Programmable integrated circuit device 100 may include configuration source 102, data register 104, data line segments 106, address register 108, CRAM 110, and buffer columns 112. Configuration source 102 contains data that is to be transmitted to data register 104. As indicated, the letter "a" corresponds to the amount of time necessary to transfer data from configuration source 102 through data register 104. Once data register 104 has received the data from configuration source 102, data register 104 propagates the data from data register 104 to each data line segment 106 in order to write the data to each CRAM 110. Buffer columns 112 re-buffer data as it propagates along a data line in order to ensure the strength of the signal does not deteriorate as data propagates through a data line. The letter "b" corresponds to the amount of time needed to charge or discharge a segment of a data line. When the data is fully propagated to all CRAM 110, address register 108 is activated, which causes data to be written into CRAM 110. In FIG. 1, the acronym "DR" stands for "Data Register," the acronym "DL" stands for "Data Line," and the acronym "AL" stands for "Address Line."

Figure 2:
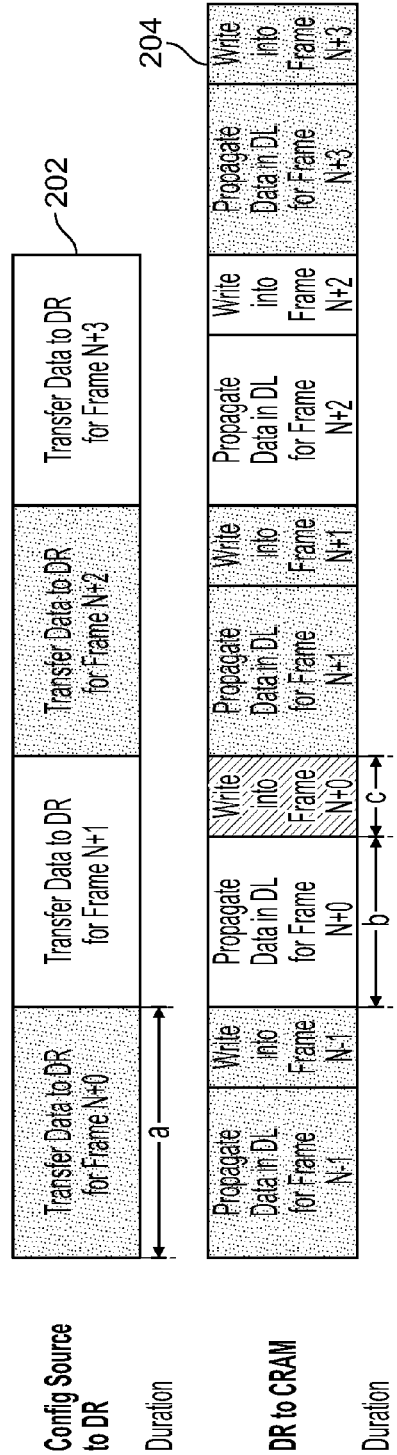
FIG. 2 depicts a timing diagram that demonstrates a length of time of which each activity described with respect to FIG. 1 requires, in accordance with some embodiments of this disclosure.

FIG. 2 depicts a timing diagram that demonstrates a length of time for which each activity described with respect to FIG. 1 requires, in accordance with some embodiments of this disclosure. Block 202 demonstrates the amount of time "a" it takes for data to transfer from configuration source 102 to data register 104. Block 204 demonstrates the amount of time "b" it takes to propagate data from the data register 104 to CRAM 110 (by way of data segments 106), such that a segment of a data line is charged or discharged. Block 204 also demonstrates the amount of time "c" it takes to write the data to CRAM 110 once it has been propagated, such that a data frame is charged or discharged. In FIG. 2, the acronym "DR" stands for "Data Register," and the acronym "DL" stands for "Data Line."

As described above, data transfer and CRAM programming may happen in parallel. Accordingly, the time to program each data frame may be described as the maximum time of (1) the amount of time it takes to transfer data from the configuration source 102 to data register 104, or (2) the amount of time it takes to both propagate data from data register 104 to data line segments 106 and write data into CRAM 110. This amount of time may be alternatively stated as follows: $T_{prog(conv)} = \max(a, (b+c))$.

Figure 3:
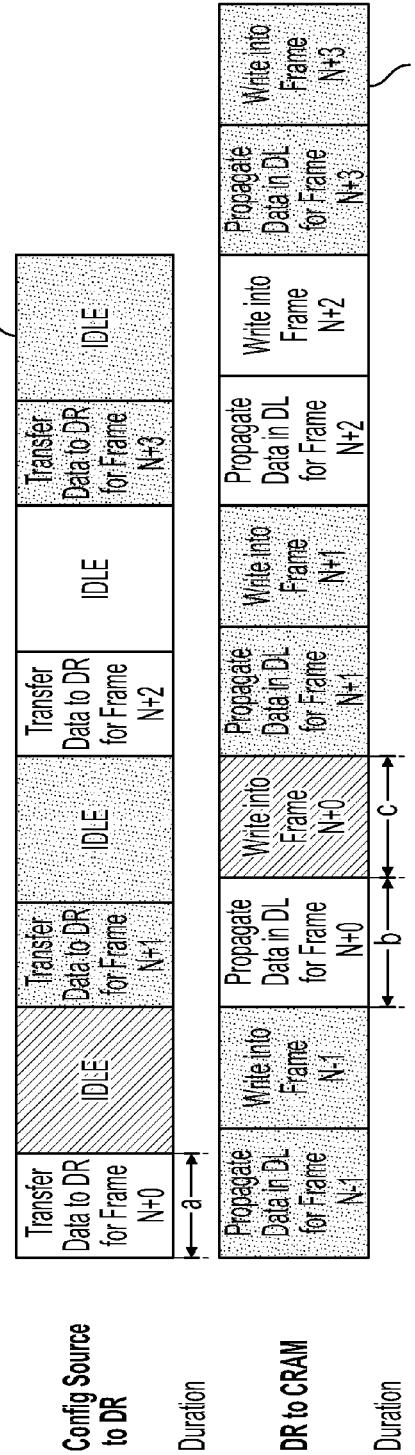
FIG. 3 depicts a timing diagram that demonstrates a length of time of which each activity described with respect to FIG. 1 would require if the time it took to transfer data from a configuration source to a data register were accelerated, in accordance with some embodiments of this disclosure.

FIG. 3 depicts a timing diagram that demonstrates a length of time for which each activity described with respect to FIG. 1 would require if the time it took to transfer data from a configuration source to a data register were accelerated, in accordance with some embodiments of this disclosure. In particular, FIG. 3 is designed to illustrate a bottleneck that occurs in the environment of programmable integrated circuit device 100, where, no matter how much an amount of time to transfer data from configuration source 102 to data register 104 is sped up, the amount of time it takes to propagate data from data register 104 to CRAM 110 and then write the data to CRAM 110 is not at all improved. As can be seen in FIG. 3, block 302 demonstrates the amount of time "a" it would take to transfer data from configuration source 102 to data register 104. Note that time "a" is significantly shorter at block 302 than it is at block 202 (corresponding to a speed-up of the time it takes to transfer data from configuration source 102 to data register 104). Block 304 demonstrates the amount of time "b" it takes to propagate data from the data register 104 to CRAM 110 (by way of data segments 106). Block 304 also demonstrates the amount of time "c" it takes to write the data to CRAM 110 once it has been propagated. Note that the combined times "b" and "c" are identical to those depicted in FIG. 2.

As described above, data transfer and CRAM programming may happen in parallel. Accordingly, with respect to FIG. 3, the time to program each data frame 110 may still be described as the maximum time of the greater of (1) the amount of time it takes to transfer data from the configuration source 102 to data register 104, or (2) the amount of time it takes to both propagate data from data register 104 to data line segments 106 and write data into CRAM 110. As above, this amount of time may be stated as follows: $T_{prog(conv)} = \max(a, (b+c))$. This is illustrative because even where the time required for data to transfer from configuration source 102 to data register 104 is reduced to less than the time it takes to both propagate data from data register 104 to data line segments 106 and write data into CRAM 110, a bottleneck is formed. Accordingly, in this scenario, the amount of time may be alternatively stated as follows: $T_{prog(conv)} = b+c$.

More recently, programmable integrated circuit devices such as FPGAs have incorporated embedded system-on-chip circuitry, which is able to help speed up the duration of time required to transfer data from configuration source 102 to data register 104 rather easily by using wider data bandwidth. This has not solved the bottleneck described above, which is the time it takes to propagate data from data register 104 through data line segments 106, as well as the enabling and disabling of address register 108 in order to write data to CRAM 110. In order to reduce programmable integrated circuit device (e.g., FPGA) boot-up time even further (e.g., by a factor of at least two times or more), while minimally impacting the amount of chip area that would have to be devoted to the components of the programmable integrated circuit device, dedicated address registers may be assigned for each data line segment, as will be discussed below with respect to FIG. 4.

Figure 4:
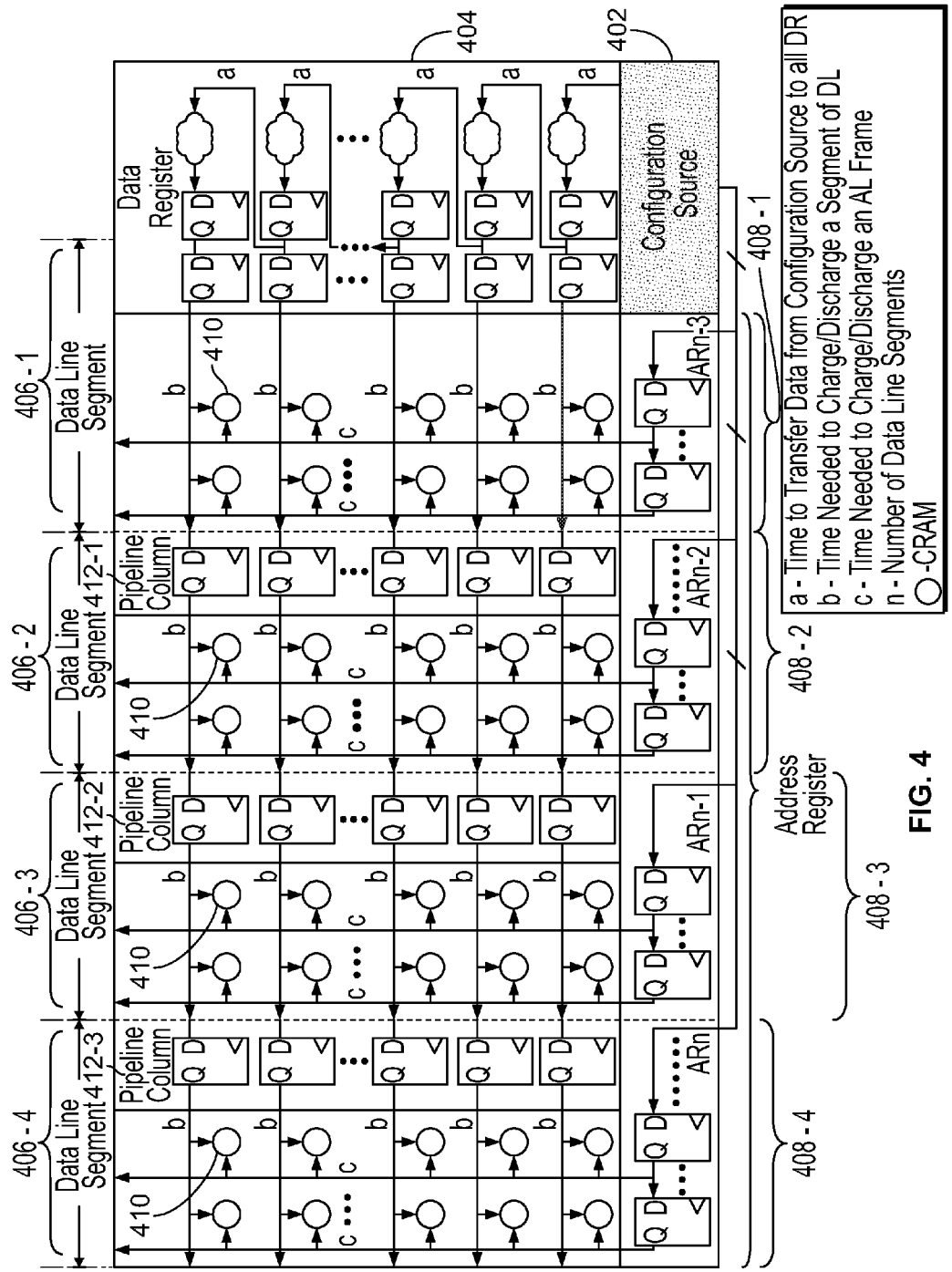
FIG. 4 is a system diagram that depicts a programmable integrated circuit device including a configuration source, a data register, data line segments, and multiple address registers, in accordance with some embodiments of this disclosure.

FIG. 4 is a system diagram that depicts a programmable integrated circuit device including a configuration source, a data register, data line segments, address registers, CRAM, and pipeline columns, in accordance with some embodiments of this disclosure. Programmable integrated circuit device 400 may include configuration source 402, data register 404, data line (DL) segments 406, address registers 408, CRAM 410, and pipeline columns 412. Programmable integrated circuit device 400 is improved by the inclusion of multiple address registers 408. The address registers 408 are also referred to as ARn, where there may be n address registers, despite only four address registers being depicted. Individual address registers 408 allow one data frame per data line segment to be written at a time. As a result, multiple CRAM 410 may be written per device at one time. Configuration source 402 contains configuration data that is to be transmitted to data register 404. As indicated, the letter "a" corresponds to the amount of time necessary to transfer data from configuration source 402 through data register 404. Once data register 404 has received the data from configuration source 402, data register 404 propagates data from data register 404 to each data line segment 406 in order to write the data to each CRAM 410. Pipeline columns 412 allow new data to propagate down each data line (e.g., new data may be pipelined down the data line each clock cycle). The letter "b" corresponds to the amount of time needed to charge or discharge a segment of a data line (DL) segment 406. When the data is propagated to CRAM 410 of an individual data line segment 406-$n$, address register 408-$n$ corresponding to data line segment 406-$n$ is activated, which causes data to be written into CRAM 410 in the corresponding data line segment 406-$n$.

By way of the steps described above with respect to FIG. 4, CRAM values are propagated through each data line segment to appropriate CRAM cells. Multiple data frames are enabled to be programmed at the same time by the CRAM values being pipelined at every data line segment 406. The frequency of pipelining of the data lines forming the data line segments 406 may depend on a tradeoff between area overhead versus configuration time reduction. In any event, each data line segment 406-$n$ will have its own corresponding address register 408. Each respective address register 408-$n$ is controlled independently by configuration source 402. For example, configuration source 402 may provide one or more input signals to each address register 408-$n$. This independent control causes write time to be significantly improved by programmable integrated circuit device 400.

According to the above description, the process of programming the data stream from configuration source 402 to CRAM 410 may be described as follows. First, data register 404 is filled with a configuration bit stream of data from configuration source 402. Next, data of the configuration bit stream (i.e., CRAM values) are shifted from data register 404 to adjacent pipeline registers of data line segments 406 until the data reaches the furthest data line segment 406. In parallel with this process, data corresponding to a next data frame will continue to fill up data register 404 from configuration source 402.

Following this process, when all pipeline columns 412 of a data line segment 406-$n$ are full with each respective CRAM value, respective address line 408-$n$ will be enabled to write the data into the respective CRAM 410-$n$. In this manner, multiple data frames are written to CRAM 410 concurrently (i.e., by writing one data frame per data line segment 406 concurrently), thus reducing configuration time (with respect to the configuration time required in known devices).

Figure 5:
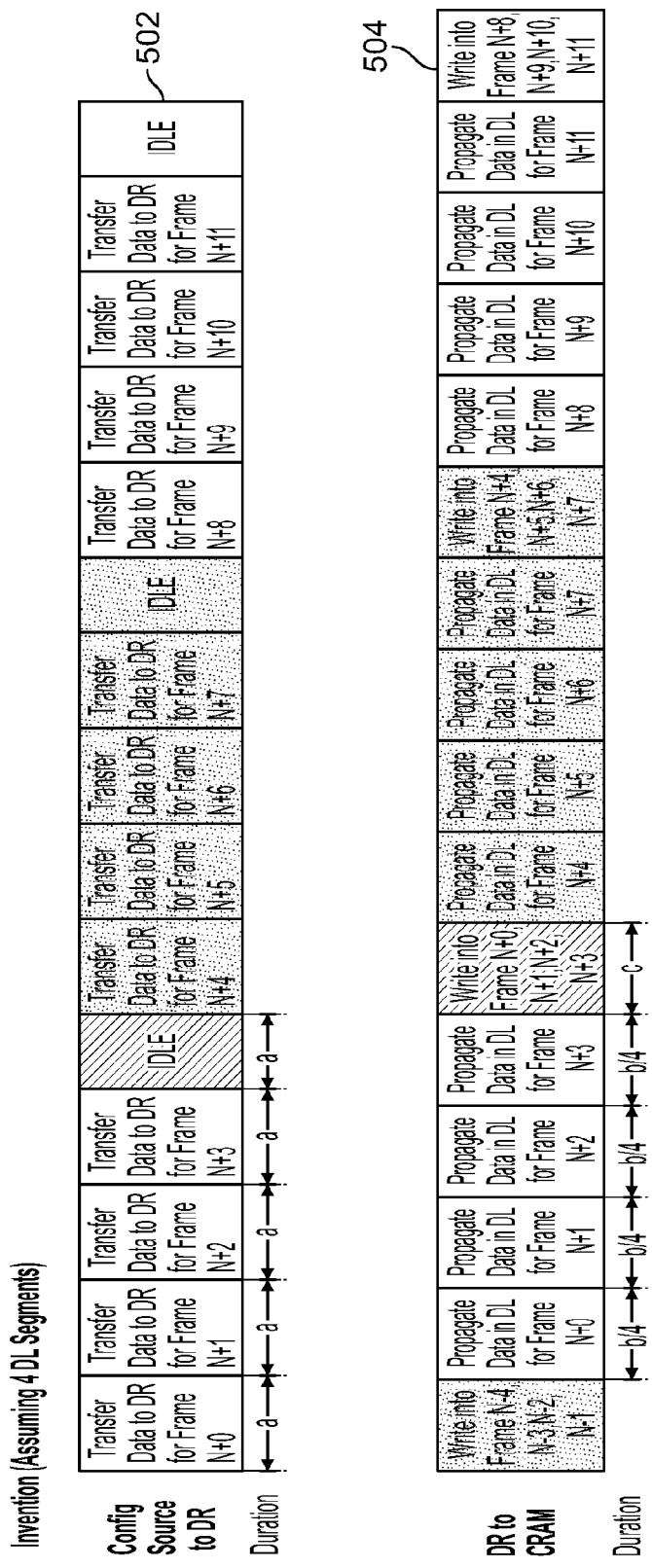
FIG. 5 depicts a timing diagram that demonstrates a length of time of which each activity described with respect to FIG. 4 requires, in accordance with some embodiments of this disclosure.

FIG. 5 depicts a timing diagram that demonstrates a length of time for which each activity described with respect to FIG. 4 requires, in accordance with some embodiments of this disclosure. FIG. 5 assumes that FIG. 4 includes four data line segments (meaning there will be three pipelining stages). Block 502 demonstrates the amount of time "a" it would take to transfer data from configuration source 402 to data register 404. Note that time "a" is significantly shorter at block 502 than it is at block 202, as it can be easily sped up. Block 504 demonstrates the amount of time it takes to propagate data from the data register 404 to CRAM 410 (by way of data segments 406). Note that the time to propagate data from data register 404 to CRAM 410 is reduced by a factor of 4 in this instance, as each data frame is able to be processed in parallel by the system of FIG. 4, and there are four data segments, each of which may handle a data frame. Accordingly the time it takes to write data to CRAM 410 for any given data frame is "b" divided by four. Block 504 also demonstrates the amount of time "c" it takes to write the data to CRAM 410 once it has been propagated. Similar to the activity described with respect to FIGS. 1-3, time "c" is not significantly sped up by the system of FIG. 4; however, write time only needs to occur once for all address registers, and therefore time "c" is only necessary once for all data line segments, whereas the systems described in FIGS. 1-3 require time "c" to occur once for each segment. Accordingly, the write time is also reduced by a factor of 4. Note that times "b" and "c" are each identical to those depicted in FIG. 2.

Accordingly, with respect to FIG. 5, the time to program each data frame to CRAM 410 may be described as the amount of time it takes to both propagate data from data register 404 to data line segments 406 and write data into CRAM 410 via data line segments 406. This amount of time may be alternatively stated as follows: $T_{prog(conv)}=(b+c)/4$. As a reminder, FIG. 5 depicts an example where four data line segments are used; however, the example of FIG. 5 is exemplary only, and the system can be scaled for N data line segments 406, which would thus cause the programming time to be reduced by a factor of N. In other words, the amount of time may be stated as $T_{prog(conv)}=(b+c)/N$ where N data line segments 406 are implemented.

A "saving factor" may also be described with reference to the improved activity described in FIGS. 4 and 5 with respect to the activity described with respect to FIGS. 1-3. In particular, the saving factor is described as follows:

$$F_{save} = \frac{T_{prog(conv)}}{T_{prog(new)}} = \frac{b+c}{\frac{b+c}{N}} = N,$$

where N is again the number of data line segments implemented. This further exemplifies that the system described with reference to FIGS. 4 and 5 can improve configuration time of CRAM in direct proportion to a number of data line segments and corresponding data registers implemented.

As described above and below, the scheme of FIGS. 4 and 5 is advantageous because programming time per data frame is made scalable, where, even for larger devices, by adding sufficient pipeline functionality (i.e., by implementing sufficient data line segments and address registers), the programming time per data frame can be reduced significantly with respect to the scheme described in FIGS. 1-3.

The scheme of FIGS. 4 and 5 is also advantageous because a certain class of applications require fast boot-up. In particular, larger devices require longer programming time. With the scheme described with respect to FIGS. 4 and 5, larger programmable integrated circuit devices, such as FPGA devices, are able to be competitive in markets where such applications are sold. Finally, this scheme is similarly able to speed up scrubbing operations as multiple data frames may be scrubbed at the same time in the environment of FIGS. 4 and 5.

Figure 6:
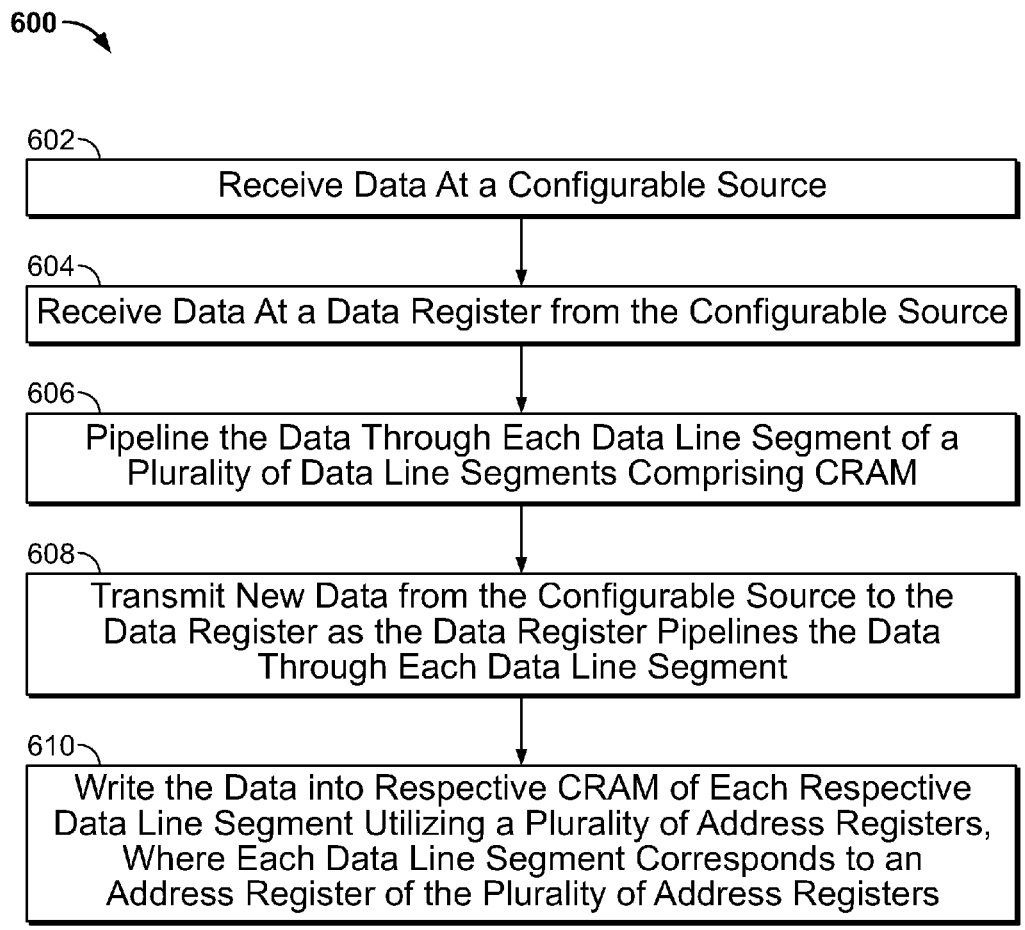
FIG. 6 is a flowchart that depicts a process for writing data into CRAM of a programmable integrated circuit device in a scalable manner, in accordance with some embodiments of the disclosure.

FIG. 6 is a flow chart that depicts a process for writing data into CRAM of a programmable integrated circuit device in a scalable manner, in accordance with some embodiments of the disclosure. Process 600 begins at 602, where data is received at a configurable source (e.g., configurable source 402). At 604, data is received at a data register (e.g., data register 404) from the configurable source (e.g., configurable source 402). At 606, data is pipelined from the data register (e.g., data register 404) through each data line segment of the device (e.g., data line segments 406), where each data line segment includes CRAM 410.

At 608, new data is transmitted from the configurable source (e.g., configurable source 402) to the data register (e.g., data register 404) as the data register pipelines the data through each data line segment. In this manner, data is able to be written to CRAM 410 in parallel to configuration source 402 populating data register 404 with new data. At 610, the data is written into respective CRAM of each respective data line segments by way of corresponding address registers 408. In some implementations, address registers 408 correspond one-to-one to data line segments 406, such that each data line segment 406 has an individual address register 408 for the purpose of writing data to CRAM 410 of the particular data line segment.

It should be understood that one or more elements (such as elements 602, 604, 606, 608, and/or 610) shown in flow diagram 600 may be combined with other elements, performed in any suitable order, performed in parallel (e.g., simultaneously or substantially simultaneously), or removed. For example, elements 606 and 608 of flow diagram 600 may be performed simultaneously, or in a different order than shown in FIG. 6. Process 600 may be implemented using any suitable combination of hardware and/or software in any suitable fashion. For example, flow diagram 600 may be implemented using instructions encoded on a non-transitory machine readable storage medium.

Figure 7:
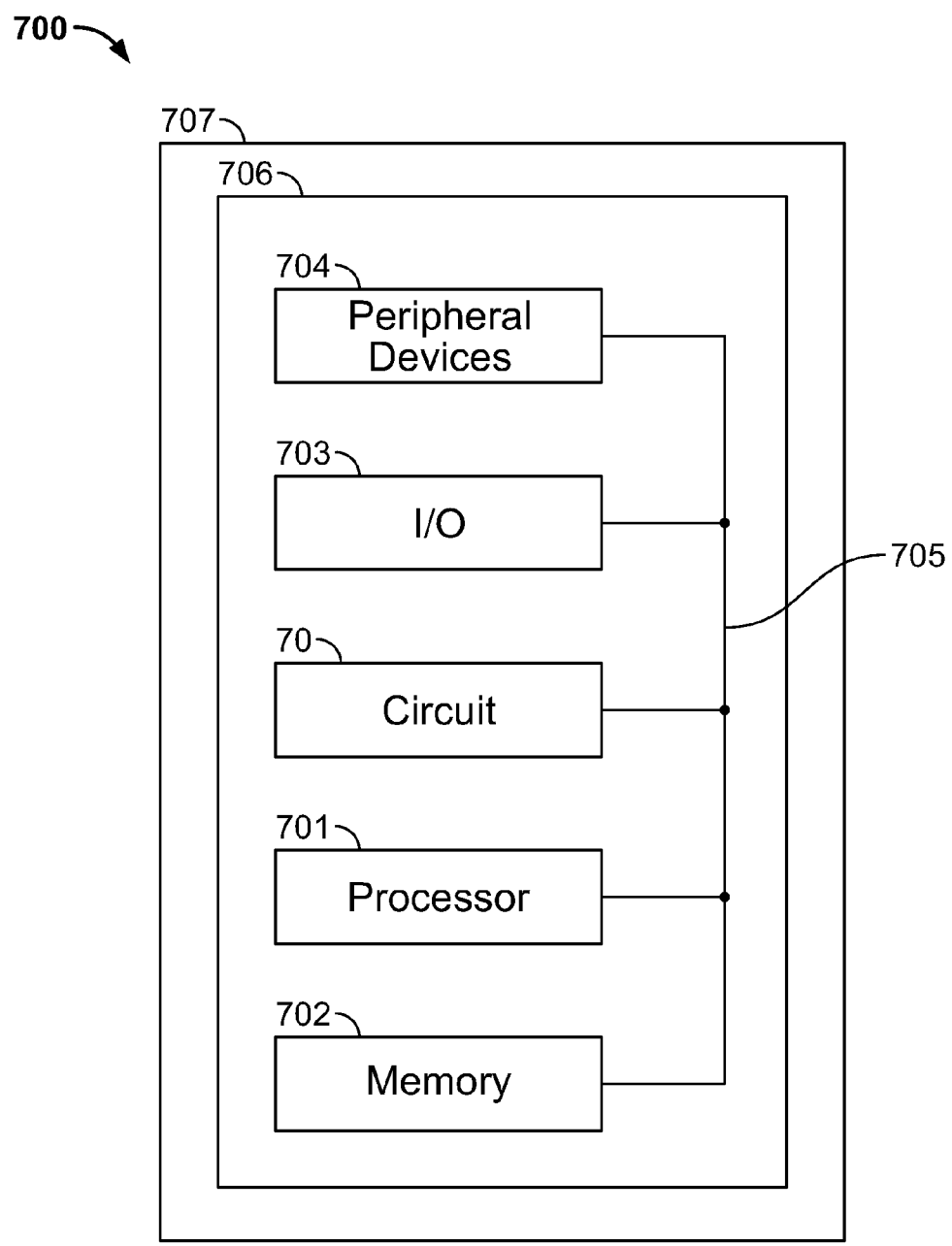
FIG. 7 is a simplified block diagram of an exemplary system employing a programmable logic device incorporating systems and methods of the present disclosure, in accordance with some embodiments of this disclosure.

As depicted in FIG. 7, an Integrated Circuit Programmable Logic Device (PLD) 700 incorporating the multiple network planes according to the present disclosure may be used in many kinds of electronic devices. Integrated Circuit Programmable Logic Device 700 may be an integrated circuit, a processing block, application specific standard product (ASSP), application specific integrated circuit (ASIC), programmable logic device (PLD) such as a field programmable gate array (FPGA), full-custom chip, or a dedicated chip, however, for simplicity, it may be referred to as PLD 700 herein. One possible use is in an exemplary data processing system 700 shown in FIG. 7. Data processing system 700 may include one or more of the following components: a processor 701; memory 702; I/O circuitry 703; and peripheral devices 704. These components are coupled together by a system bus 705 and are populated on a circuit board 706 which is contained in an end-user system 707.

System 700 can be used in a wide variety of applications, such as computer networking, data networking, instrumentation, video processing, digital signal processing, or any other application where the advantage of using programmable or reprogrammable logic is desirable. PLD 700 can be used to perform a plurality of different logic functions. For example, PLD 700 can be configured as a processor or controller that works in cooperation with processor 701. PLD 700 may also be used as an arbiter for arbitrating access to a shared resource in system 700. In yet another example, PLD 700 can be configured as an interface between processor 701 and one of the other components in system 700. It should be noted that system 700 is only exemplary, and that the true scope and spirit of the invention should be indicated by the following claims.

Various technologies can be used to implement PLDs 700 as described above and incorporating this disclosure.

FIG. 8 presents a cross section of a magnetic data storage medium 810 which can be encoded (e.g., a program that includes the steps of FIG. 6) with a machine executable program that can be carried out by systems such as a workstation or personal computer, or other computer or similar device. Medium 810 can be a floppy diskette or hard disk, or magnetic tape, having a suitable substrate 811, which may be conventional, and a suitable coating 812, which may be conventional, on one or both sides, containing magnetic domains (not visible) whose polarity or orientation can be altered magnetically. Except in the case where it is magnetic tape, medium 810 may also have an opening (not shown) for receiving the spindle of a disk drive or other data storage device.

The magnetic domains of coating 812 of medium 810 are polarized or oriented so as to encode, in manner which may be conventional, a machine-executable program, for execution by a programming system such as a workstation or personal computer or other computer or similar system, having a socket or peripheral attachment into which the PLD to be programmed may be inserted, to configure appropriate portions of the PLD, including its specialized processing blocks, if any, in accordance with the invention.

FIG. 9 shows a cross section of an optically-readable data storage medium 910 which also can be encoded with such a machine-executable program (e.g., a program that includes the steps of FIG. 6), which can be carried out by systems such as the aforementioned workstation or personal computer, or other computer or similar device. Medium 910 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 910 preferably has a suitable substrate 911, which may be conventional, and a suitable coating 912, which may be conventional, usually on one or both sides of substrate 911.

In the case of a CD-based or DVD-based medium, as is well known, coating 912 is reflective and is impressed with a plurality of pits 913, arranged on one or more layers, to encode the machine-executable program. The arrangement of pits is read by reflecting laser light off the surface of coating 912. A protective coating 914, which preferably is substantially transparent, is provided on top of coating 912.

In the case of magneto-optical disk, as is well known, coating 912 has no pits 913, but has a plurality of magnetic domains whose polarity or orientation can be changed magnetically when heated above a certain temperature, as by a laser (not shown). The orientation of the domains can be read by measuring the polarization of laser light reflected from coating 912. The arrangement of the domains encodes the program as described above.

It will be understood that the foregoing is only illustrative of the principles of the disclosure, and that various modifications can be made by those skilled in the art without departing from the scope and spirit of the disclosure. For example, the various elements of this disclosure can be provided on a PLD in any desired number and/or arrangement. One skilled in the art will appreciate that the present disclosure can be practiced by other than the described embodiments, which are presented for purposes of illustration and not of limitation, and the present invention is limited only by the claims that follow.

No admission is made that any portion of the disclosure, whether in the background or otherwise, forms a part of the prior art.

The invention claimed is:

1. A programmable integrated circuit device, comprising:
a plurality of data line segments comprising configuration random access memory (CRAM), wherein each data line segment is configured to receive data via a pipeline column or a data register, wherein the respective pipeline column and the data register are configured to pipeline the data through a respective data line segment of the plurality of data line segments; and
a plurality of address registers, wherein each address register of the plurality of address registers corresponds to a respective data line segment of the plurality of data line segments, and wherein a respective address register of the plurality of address registers is configured to activate when the data is propagated to a respective CRAM of a respective data line segment of the plurality of data line segments.

2. The programmable integrated circuit device of claim 1, wherein the data received by a respective data line segment of the plurality of data line segments comprises data of a data frame.

3. The programmable integrated circuit device of claim 1, wherein the data is written into the respective CRAM of the respective data line segment after the respective address register is activated.

4. The programmable integrated circuit device of claim 3, wherein data previously written into the respective CRAM is scrubbed when the data is written into the respective CRAM.

5. The programmable integrated circuit device of claim 1, wherein the data is written into the respective CRAM of the respective data line segment one frame at a time.

6. The programmable integrated circuit device of claim 1, wherein the data comprises null data.

7. The programmable integrated circuit device of claim 1, wherein the programmable integrated circuit device comprises a field programmable gate array device.

8. The programmable integrated circuit device of claim 1, wherein the data is propagated to the respective CRAM by shifting data of one CRAM of one data line segment of the plurality of data line segments to a next data line segment in a direction of data propagation until a last data line segment of the plurality of data line segments is reached.

9. The programmable integrated circuit device of claim 8, wherein new data is transmitted to the data register or the pipeline column as the data of the one CRAM shifts to the next data line segment in the direction of data propagation.

10. The programmable integrated circuit device of claim 1, wherein an amount of data line segments that the plurality of data line segments consists of is inversely proportional to an amount of time required to write a given set of data to the respective CRAM.

11. A method of operating a programmable integrated circuit device, comprising:
pipelining data to each data line segment of a plurality of data line segments comprising configuration random access memory (CRAM); and
activating a respective address of plurality of address registers when the data is propagated to a respective data line segment of the plurality of data line segments, wherein each of the plurality of address registers corresponds to a respective data line segment of the plurality of data line segments, and wherein the data is configured to be written into a respective CRAM of the respective data line segment when the respective address is activated.

12. The method of claim 11, wherein the data pipelined into any particular data line segment of the plurality of data line segments is data of a data frame.

13. The method of claim 11, wherein the data is written into the respective CRAM of each respective data line segment one frame at a time.

14. The method of claim 11, wherein the data comprises null data.

15. The method of claim 11, comprising scrubbing data previously written into the respective CRAM when the data is written into the respective CRAM.

16. The method of claim 11, wherein pipelining the data to each data line segment of the plurality of data line segments comprises shifting data of each respective CRAM of each respective data line segment of the plurality of data line segments to a next data line segment in a direction of data propagation until a last data line segment is reached.

17. A non-transitory machine-readable medium comprising instructions stored thereon for configuring a programmable integrated circuit device, the instructions comprising:
instructions to pipeline data to a first data line segment and a second data line segment, wherein the first data line segment and the second data line segment comprises a first configuration random access memory (CRAM) and a second CRAM, respectively; and
instructions to activate a first address register associated with the first data line segment when the data is propagated to the first data line segment;
instructions to activate a second address register associated with the second data line segment when the data is propagated to the second data line segment;
instructions to write the data into the first CRAM when the first address is activated; and
instructions to write the data into the second CRAM when the second address is activated.

18. The non-transitory machine-readable medium of claim 17, wherein the data is written into the first CRAM one frame at a time.

19. The non-transitory machine-readable medium of claim 16, wherein the data comprises null data.

20. The non-transitory machine-readable medium of claim 16, wherein the instructions comprises instruction to scrub data previously written into the first CRAM when the data is written into the first CRAM.

* * * * *